United States Patent [19]

White, Jr.

[11] 4,352,996

[45] Oct. 5, 1982

[54] IGFET CLOCK GENERATOR CIRCUIT EMPLOYING MOS BOATSTRAP CAPACITIVE DRIVE

[75] Inventor: Lionel S. White, Jr., Houston, Tex.

[73] Assignee: Texas Instruments Incorporated, Dallas, Tex.

[21] Appl. No.: 133,378

[22] Filed: Mar. 21, 1980

[51] Int. Cl.[3] .......................... H03K 5/01; H03K 5/05; H03K 17/10; H03K 17/284
[52] U.S. Cl. .................................... 307/269; 307/578; 307/601; 307/605
[58] Field of Search ............... 307/482, 578, 269, 262, 307/594, 601, 605

[56] References Cited

U.S. PATENT DOCUMENTS 3,774,055 11/1973 Bapat ................................. 307/482
3,835,457 9/1974 Yu ...................................... 307/482
4,061,933 12/1977 Schroeder et al. ........... 307/DIG. 4

*Primary Examiner*—Larry N. Anagnos
*Attorney, Agent, or Firm*—John G. Graham

[57] ABSTRACT

A random access read/write MOS memory device or the like employs a clock driver circuit which includes a push-pull type output stage with two transistors having a clock Φ and its complement Φ as gate inputs. An output node is pulled to a full supply voltage level by a pump transistor connecting the output node to the supply and having a delayed clock coupled to its gate. Another transistor with the supply voltage on its gate connects the output node to the gate of the pump transistor.

11 Claims, 2 Drawing Figures

IGFET CLOCK GENERATOR CIRCUIT EMPLOYING MOS BOATSTRAP CAPACITIVE DRIVE

BACKGROUND OF THE INVENTION

This invention relates to semiconductor circuits and more particularly to a delay circuit of the type useful clock generators in semiconductor memory devices or the like.

In semiconductor memory devices of the type described in Electronics, Sept. 26, 1978, pp. 109+, or pending application Ser. No. 944,822, and now U.S. Pat. No. 4,239,993, clock generators are employed which have output driver circuits for driving capacitive loads between a low level, usually ground, and a high level of the supply voltage or a one-threshold drop from the supply voltage. The latter type is usually faster in operation than the former, i.e., introduces a smaller increment of delay. In some instances the clock output should go to the supply but the initial transition should be a small delay increment, so neither type of clock driver is suitable.

It is therefore the principal object of this invention to provide an improved clock driver circuit, particularly one which introduces a small delay increment but yet may be pumped to a full supply voltage level.

SUMMARY OF THE INVENTION

In accordance with an embodiment of the invention, a clock driver circuit includes a push-pull type output stage with two transistors having a clock $\Phi$ and its complement $\bar{\Phi}$ as gate inputs. An output node is pulled to a full supply voltage level by a pump transistor connecting the output node to the supply and having a delayed clock coupled to its gate. Another transistor with the supply voltage on its gate connects the output node to the gate of the pump transistor.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
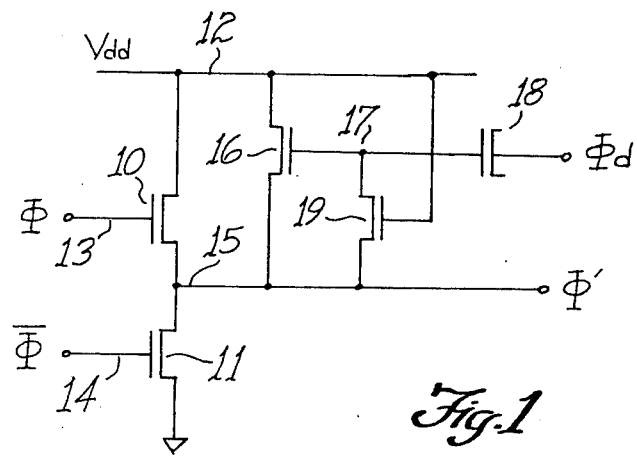
FIG. 1 is an electrical schematic diagram of a circuit according to the invention.
Figure 2:
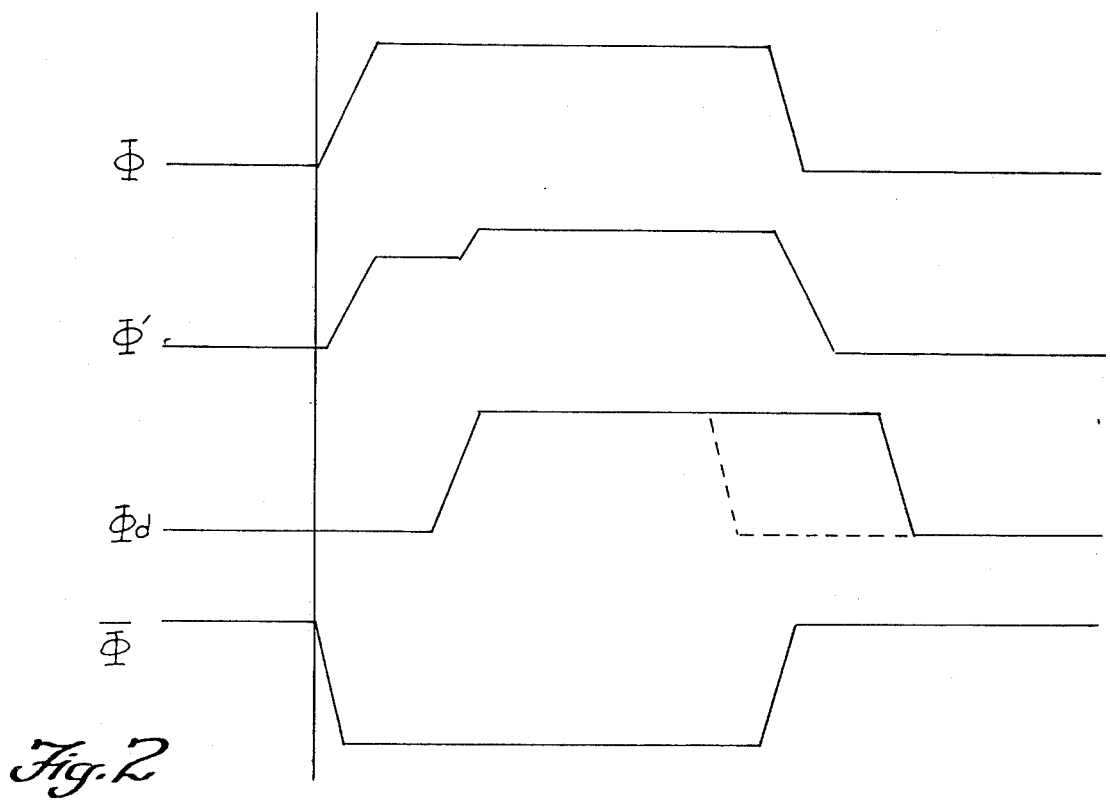
FIG. 2 is a graphic representation of voltage vs. time for voltages appearing in the circuit of FIG. 1.

With reference to FIG. 1, a circuit according to the invention is illustrated. A pair of series transistors 10 and 11 is connected between a Vdd supply line 12 and ground. The gates 13 and 14 of the transistors 10 and 11 are connected to $\Phi$ and $\bar{\Phi}$ clocks, respectively, the waveforms of which are shown in FIG. 2. An output node 15 at the juncture of the source-to-drain paths of the transistors 10 and 11 will have a voltage thereon which is labelled as $\Phi'$ in FIG. 2. This voltage initially goes to a level of Vdd-Vt, one threshold voltage down from the supply, but then is pumped up to the supply level. The pump circuit consists of a transistor 16 connected between the output node 15 and the supply 12, with the gate node 17 of this transistor 16 being coupled by a capacitor 18 to a $\Phi d$ clock which is also seen in FIG. 2. A transistor 19 having its gate connected to Vdd line 12 couples the node 17 to the output node 15.

In operation, when $\Phi$ goes high the output $\Phi'$ on node 15 will follow with a Vt delay of about two nanosecond. At this point, $\Phi'$ goes to Vdd-Vt; as $\Phi'$ goes high so will the node 17. When $\Phi d$ goes high (after $\Phi'$ has closely approached Vdd-Vt) the node 17 will be boosted to higher than Vdd, driving the transistor 16 into the linear region and pulling $\Phi'$ on up to Vdd. When $\bar{\Phi}$ goes high it will begin discharging $\Phi'$, and when $\Phi'$ falls to a Vt below Vdd the voltage on the node 17 will discharge through the transistor 19, cutting off the transistor 16.

It is necessary to ratio the transistors 11 and 16 in order to allow $\Phi'$ to be discharged. The transistor 11 must be much larger than transistor 16. Otherwise the transistor 16 will keep $\Phi'$ at such a high level that the node 17 would not be discharged. Alternatively, $\Phi d$ may be discharged before $\Phi'$ is discharged as seen in FIG. 2 (dotted). In this case the transistors 11 and 16 need not be ratioed.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A clock driver circuit for producing a slightly delayed clock signal at full supply voltage level, comprising first, second and third transistors, each of said transistors having a current path and a control electrode, the current paths of the first and second transistors being connected in series between a supply voltage and reference potential with the juncture between the current paths of the first and second transistors being an output node, the current path of the third transistor being separately connected between said output node and supply voltage, means for applying an input clock signal to the control electrode of the first transistor and the complement of the input clock signal to the control electrode of the second transistor, conductive coupling means for connecting the control electrode of the third transistor to the output node and to a clock voltage having a transition after that of said input clock signal.

2. A circuit according to claim 1 wherein said transistors are insulated gate field effect transistors.

3. A circuit according to claim 2 wherein said conductive coupling means for connecting is a fourth insulated gate field effect transistor.

4. A circuit according to claim 1 wherein a fourth transistor connects said output node to the control electrode of the third transistor, the fourth transistor having a control electrode connected to a said supply voltage.

5. A circuit according to claim 4 wherein the transistors are insulated gate field effect transistors and the channel width to length ratio of said second transistor is greater than that of said third transistor.

6. A circuit according to claim 4 wherein said coupling means includes an MOS capacitor connecting said control electrode of the third transistor to said clock voltage.

7. A circuit according to claim 6 wherein the control electrode of said first transistor is held at a high level until after said transition, then the control electrode goes to ground.

8. A circuit according to claim 6 wherein all said transistors are N-channel insulated gate field effect transistors.

9. A circuit according to claim 8 wherein said transition is from a level of about ground to a positive supply voltage level.

10. A circuit according to claim 9 wherein the voltage on said output node first goes to a level below the supply voltage then is boosted to the supply voltage at said transition.

11. A circuit according to claim 10 wherein said clock voltage having a transition after that of said input clock signal stays at ground after said input clock makes a transition from said supply voltage to ground.

* * * * *

UNITED STATES PATENT AND TRADEMARK OFFICE
CERTIFICATE OF CORRECTION

PATENT NO. : 4,352,996

DATED : October 5, 1982

INVENTOR(S) : Lionel S. White, Jr.

It is certified that error appears in the above-identified patent and that said Letters Patent are hereby corrected as shown below:

In the Title of Invention, change "BOATSTRAP" to --BOOTSTRAP--.

Signed and Sealed this

Twenty-eighth Day of August 1984

[SEAL]

Attest:

GERALD J. MOSSINGHOFF

Attesting Officer

Commissioner of Patents and Trademarks